United States Patent
Yanagisawa

(10) Patent No.: US 8,506,175 B2
(45) Date of Patent: Aug. 13, 2013

(54) OPTICAL WAVEGUIDE BOARD

(75) Inventor: Kenji Yanagisawa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 174 days.

(21) Appl. No.: 12/969,853

(22) Filed: Dec. 16, 2010

(65) Prior Publication Data
US 2011/0188802 A1 Aug. 4, 2011

(30) Foreign Application Priority Data

Dec. 18, 2009 (JP) .................................. 2009-287910

(51) Int. Cl.
G02B 6/42 (2006.01)
(52) U.S. Cl.
USPC .......................................................... 385/88
(58) Field of Classification Search
None
See application file for complete search history.

(56) References Cited

U.S. PATENT DOCUMENTS

| 2007/0183718 A1* | 8/2007 | Bae et al. ........................ 385/47 |
| 2007/0280585 A1 | 12/2007 | Warashina et al. |
| 2008/0131050 A1* | 6/2008 | Yanagisawa ..................... 385/14 |

FOREIGN PATENT DOCUMENTS

| JP | 2002-174744 | 6/2002 |
| JP | 2004-012889 | 1/2004 |
| WO | WO 2005/078490 | 8/2005 |

* cited by examiner

*Primary Examiner* — Jerry Rahll
(74) *Attorney, Agent, or Firm* — Drinker Biddle & Reath LLP

(57) ABSTRACT

An optical waveguide board includes: an optical waveguide configured to transmit an optical signal to and from a light receiving element and a light emitting element; wiring patterns that are electrically connected with the light receiving and emitting elements, respectively; and supporting members disposed on the wiring patterns on sides of end parts of the optical waveguide, the supporting members supporting the light receiving and emitting elements, respectively; wherein each of the supporting members includes: a conduction portion that electrically connects a corresponding one of the light receiving and emitting elements and the wiring pattern; and a smooth surface configured to reflect the optical signal appearing between the corresponding one of the light receiving and emitting elements and the optical waveguide.

5 Claims, 9 Drawing Sheets

OPTICAL WAVEGUIDE BOARD

BACKGROUND

1. Field of the Invention

The present invention relates to technology which is effective when applied to an optical waveguide board that includes an optical waveguide for transmitting an optical signal between light receiving and emitting elements (signifying a light emitting element and/or a light receiving element).

2. Description of the Related Art

JP-A-2002-174744 discloses a technique wherein mirrors and via holes are formed in an optical wiring layer (optical waveguide) which is formed on a glass substrate by the use of an optical wiring layer material (for example, polyimide). Concretely, the mirrors which reflect the optical signal of optical elements (light receiving and emitting elements) into the optical wiring layer, and the via holes which are connected to the optical elements are formed in the optical wiring layer.

For example, an electronic circuit which is so configured that a semiconductor device is mounted on a wiring board (electric board), the rate of signal transmission becomes high on account of rise in the operating speed (operating frequency) of the semiconductor device such as a CPU. In consequence, noise which causes malfunctions is liable to occur from the electric wiring of the wiring board.

In this regard, there has been studied an optical/electrical hybrid device employing a technique wherein part of the electric wiring which constitutes the electronic circuit is substituted from the electric wiring into optical wiring based on an optical waveguide, so as to transmit a signal by light receiving and emitting elements. This technique uses an optical waveguide board including a first clad layer, a core layer which is formed thereon and which transmits the optical signal, a second clad layer which is formed on the first clad layer so as to cover the core layer, and mirrors which change the propagation directions of the optical signal by reflections.

Now, an example of the optical waveguide board studied by the inventor will be explained with reference to FIG. 1A through FIG. 3B. FIGS. 1A through 3B are explanatory views schematically showing the essential portions of the optical waveguide board (one end side of the optical waveguide) under a manufacturing process studied by the inventor, and FIGS. 1A, 2A and 3A are plan views, while FIGS. 1B, 2B and 3B are sectional views taken along lines X-X in FIGS. 1A, 2A and 3A, respectively. Incidentally, one end side of the optical waveguide is illustrated in the drawings and will be explained, and the other end side is similar and shall therefore be omitted from the explanation.

First, as shown in FIGS. 1A and 1B, wiring patterns 103 having connection pads 102 are formed on a wiring board which is formed with electric wiring (and which serves as the substrate 101 of an optical waveguide board). Incidentally, the diameter of each connection pad 102 within a plane is, for example, 90 μm, and the pitch between the adjacent wiring patterns 103 is, for example, 125 μm.

Subsequently, a resin to become a clad layer 104 is formed and hardened on the substrate 101 so as to cover the wiring patterns 103. Subsequently, a resin which has a refractive index larger than that of the clad layer 104 and which becomes a core layer 105 is formed and hardened on the clad layer 104, and it is thereafter patterned so as to extend as the core layer 105. Subsequently, the resin which is identical to that of the clad layer 104 and which becomes a clad layer 106 is formed and hardened on the clad layer 104 so as to cover the core layer 105. Incidentally, the width of each pattern of the clad layer 105 within the plane is, for example, 35 μm, and the pitch between the adjacent patterns of the clad layer 105 is, for example, 250 μm.

In this way, the optical waveguide which is configured of the core layer 105, and the clad layers 104 and 106 holding the core layer 105 therebetween, is formed in the surface layer of the substrate 101 (wiring board). Here, the core layer 105 and the clad layers 104 and 106, namely, the optical waveguide are/is made from, for example, an epoxy type resin or a polyimide type resin, which is a resin excellent for optical characteristics as the optical waveguide. Besides, the resins which are used for the core layer 105 and the clad layers 104 and 106 shrink due to the hardening. Therefore, especially the core layer 105 is formed having a certain degree of design margin.

Subsequently, as shown in FIGS. 2A and 2B, at the end part of the optical waveguide, a smooth surface 107 which inclines to the extending direction of the core layer 105 (a direction in which an optical signal is transmitted) is formed by, for example, a dicer, and a metal film 108 is thereafter formed on the smooth surface 107.

The metal film 108 serves as a mirror which changes the propagating direction of light between a light receiving or emitting element and the optical waveguide, by reflection. Therefore, the formation of the smooth surface 107 on which the metal film 108 is to be formed becomes important for the transmission efficiency of the optical signal. That is, in forming the smooth surface 107 by the dicer, a high precision is required.

Subsequently, through-holes 109 are formed in the clad layers 104 and 106 overlying the wiring patterns 103, so as to expose the connection pads 102 of the wiring patterns 103, by employing a photolithographic technique and an etching technique by way of example. Incidentally, each through-hole 109 has a diameter of, for example, 80 μm, and it is formed at a precision of, for example, ±2 μm.

Subsequently, as shown in FIGS. 3A and 3B, the through-holes 109 are filled up with a conductive material (for example, copper) by employing, for example, an electroless plating technique, thereby to form vias 110. Thus, the optical waveguide board 111 is substantially completed.

Incidentally, it has been revealed as the result of study that, in the case where the through-holes 109 are filled up with the conductive material by the electroless plating technique, they are insufficiently filled up when the aspect ratio (diameter/height) of each of them is one or less. Besides, it is considered that, in a case where the through-holes 109 are configured by forming through-holes in each of the clad layers 104 and 106 by patterning, and then joining the corresponding through-holes of the respective clad layers 104 and 106, a higher positional precision (patterning precision) will be required.

Thereafter, a light receiving element and a light emitting element are respectively mounted on both the end sides of the optical waveguide on the optical waveguide board 111. In FIGS. 3A and 3B, the connection terminal 113 of a light receiving/emitting element 112, which is the light receiving element or the light emitting element, is electrically connected with the via 110 on the side of the end part of the optical waveguide. Besides, the light receiving or emitting element 112 mounted on the optical waveguide board 111 is electrically connected with the wiring pattern 103 through the via 110, and it receives a control signal from this wiring pattern 103.

Thus, an optical signal 114 for the light receiving or emitting element 112 can be transmitted through the smooth surface 107 (metal film 108), between the light receiving or emitting element 112 and the core layer 105 which constitutes the optical waveguide. More specifically, an optical signal emitted from the light emitting portion of the light emitting element is reflected by a mirror on one end side of the optical waveguide and then transmitted through the core layer 105 of the optical waveguide, and it is further reflected by a mirror on the other end side of the optical waveguide and then received by the light receiving portion of the light receiving element.

Here, in case of considering the transmission efficiency of the optical signal, the positional precisions of the optical waveguide (core layer 105), the smooth surface 107 on which the metal film 108 to serve as the mirror is formed, and the via 110 become important in the optical waveguide board 111.

By way of example, let's consider a case where positional deviations have appeared in the smooth surface 107 and the via 110. The light receiving or emitting element 112 which is mounted on the optical waveguide board 111 has its connection terminal 113 connected with the via 110, so that the position of the light receiving or emitting portion of the light receiving or emitting element 112 is determined with reference to the via 110. When the positional deviations have appeared in the smooth surface 107 and the via 110, also the position of the light receiving or emitting portion of the light receiving or emitting element 112 relative to the smooth surface 107 deviates.

Thus, part of the optical signal emitted from the light emitting portion of the light emitting element and then reflected by the mirror, fails to enter the core layer 105, and the transmission efficiency of the optical signal in the optical waveguide board 111 lowers. Besides, part of the optical signal exiting from the core layer 105 is reflected by the mirror without being received by the light receiving portion of the light receiving element, and the transmission efficiency of the optical signal in the optical waveguide board 111 lowers.

SUMMARY

An object of the present invention is to provide a technique which can enhance the transmission efficiency of an optical signal. The above and other objects and novel features of the present invention will become apparent from the description of this specification when read in conjunction with the accompanying drawings.

According to an aspect of the invention, there is provided an optical waveguide board including: an optical waveguide configured to transmit an optical signal to and from a light receiving element and a light emitting element; wiring patterns that are electrically connected with the light receiving and emitting elements, respectively; and supporting members disposed on the wiring patterns on sides of end parts of the optical waveguide, the supporting members supporting the light receiving and emitting elements, respectively; wherein each of the supporting members includes: a conduction portion adapted to be electrically connected with a corresponding one of the light receiving and emitting elements and the wiring pattern; and a smooth surface configured to reflect the optical signal appearing between the corresponding one of the light receiving and emitting elements and the optical waveguide.

An advantage which is attained by the typical one of the inventions disclosed in the present application will be briefly explained. With the optical waveguide board in the embodiment, the transmission efficiency of the optical signal can be enhanced.

BRIEF DESCRIPTION OF THE DRAWINGS

The present invention will become more fully understood from the detailed description given hereinbelow and the accompanying drawing which is given by way of illustration only, and thus is not limitative of the present invention and wherein:

FIG. 1A is a plan view, while FIG. 1B is a sectional view taken along line X-X in FIG. 1A;

FIG. 2A is a plan view, while FIG. 2B is a sectional view taken along line X-X in FIG. 2A;

FIG. 3A is a plan view, while FIG. 3B is a sectional view taken along line X-X in FIG. 3A;

FIG. 5A is a plan view, FIG. 5B is a sectional view taken along line X-X in FIG. 5A, and FIG. 5C is a sectional view taken along line Y-Y in FIG. 5A;

FIG. 6A is a plan view, while FIG. 6B is a sectional view taken along line X-X in FIG. 6A;

FIG. 12A is a plan view, while FIG. 12B is a sectional view taken along line X-X in FIG. 12A.

DETAILED DESCRIPTION OF THE INVENTION

Figure 1A:
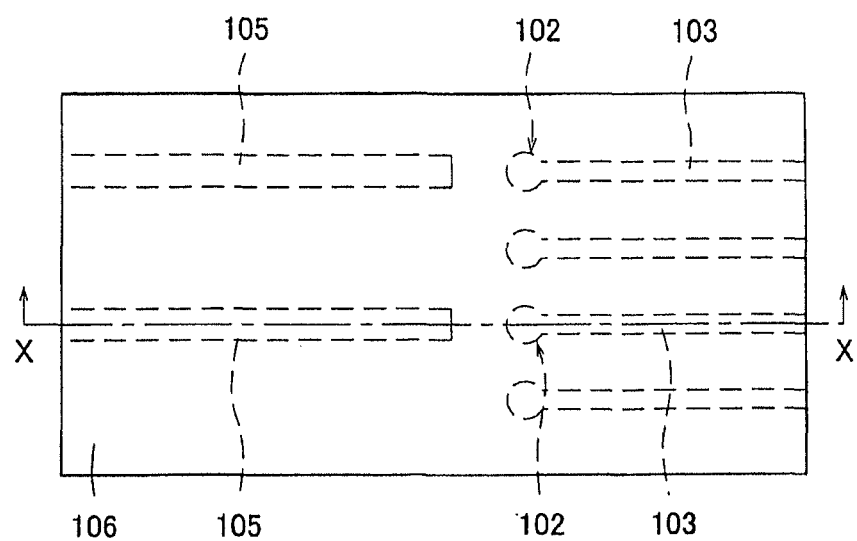
FIGS. 1A and 1B are explanatory views schematically showing the essential portions of an optical waveguide board under manufacturing steps which have been studied by the inventor.
Figure 1B:
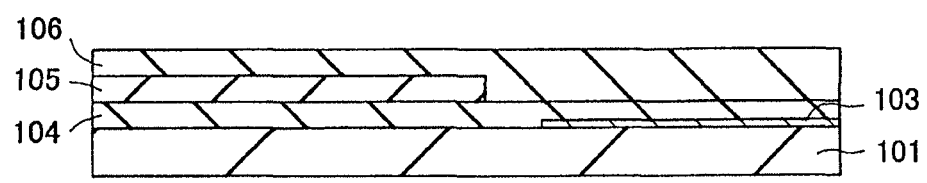
Figure 2A:
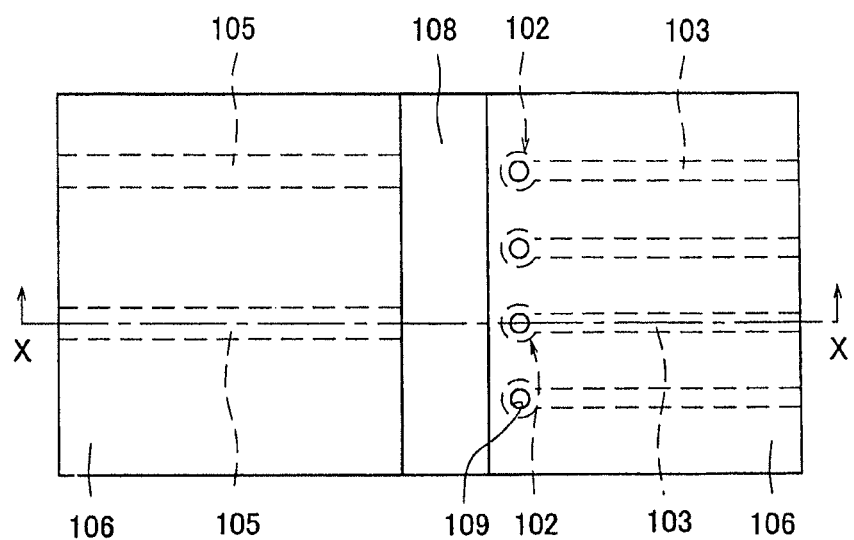
FIGS. 2A and 2B are explanatory views schematically showing the essential portions of the optical waveguide board under manufacturing steps subsequent to those of FIGS. 1A and 1B.
Figure 2B:
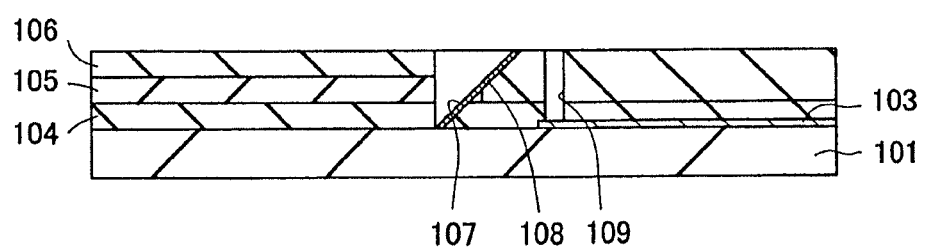
Figure 3A:
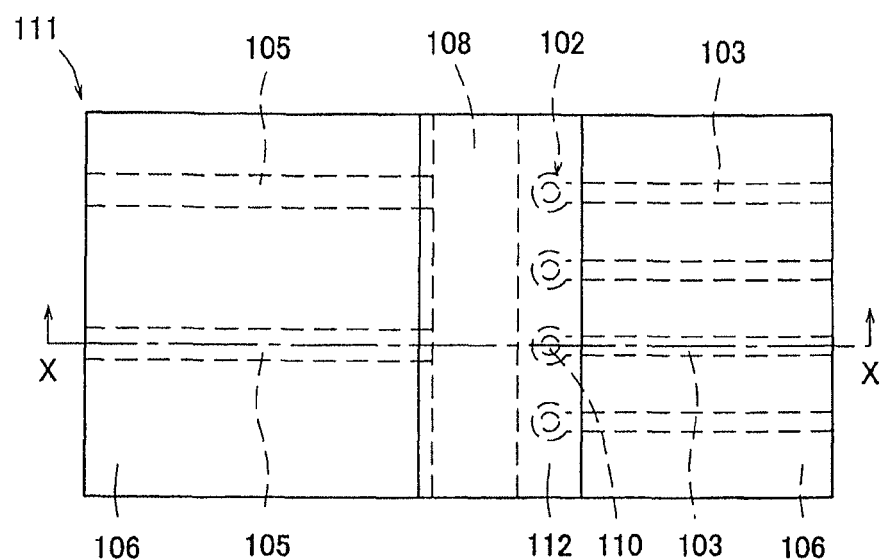
FIGS. 3A and 3B are explanatory views schematically showing the essential portions of the optical waveguide board under manufacturing steps subsequent to those of FIGS. 2A and 2B.
Figure 3B:
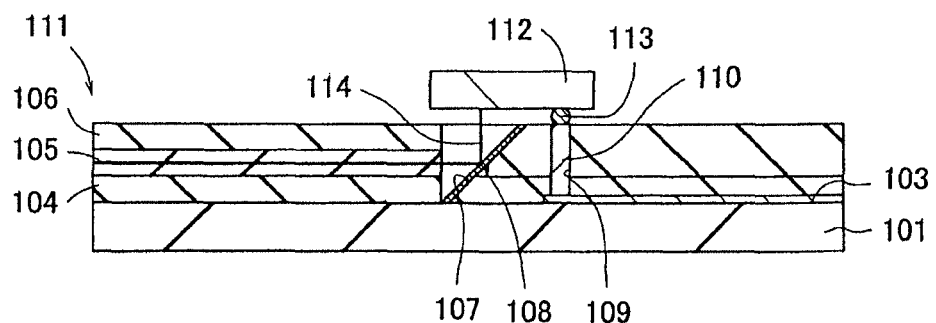

Now, embodiments of the present invention will be described in detail with reference to the drawings.

By the way, throughout the drawings for describing the embodiments, identical reference numerals are assigned to members having identical functions, and they shall be sometimes omitted from repeated description.

Figure 4:
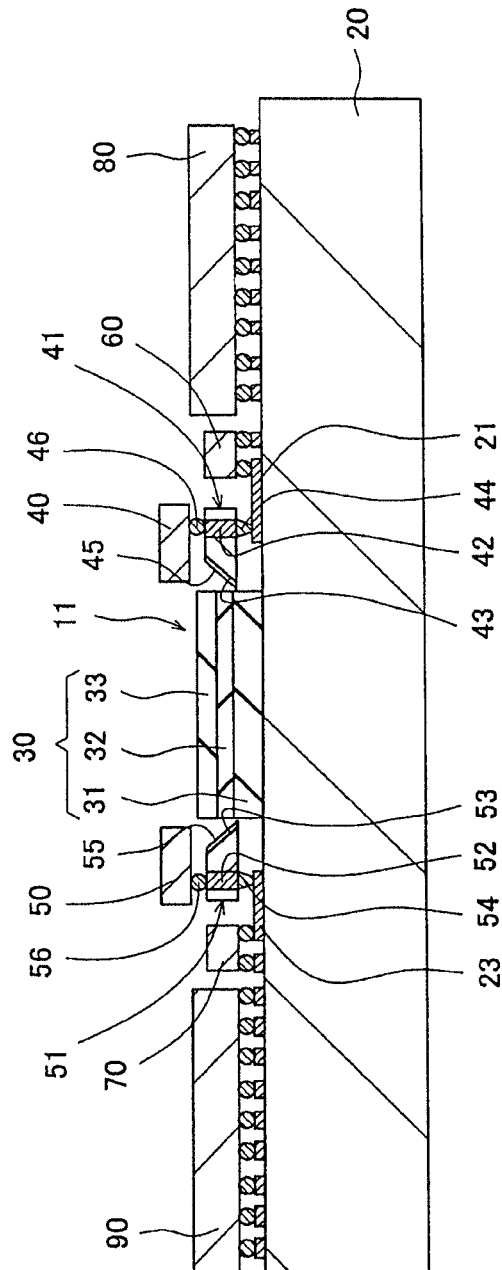
FIG. 4 is an explanatory view schematically showing an optical/electrical hybrid device which includes an optical waveguide board in one embodiment of the present invention.
Figure 5A:
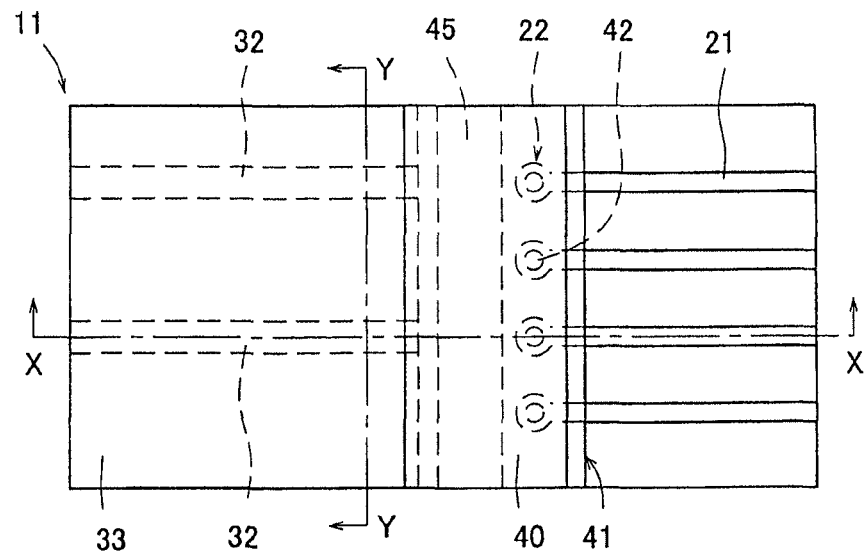
FIGS. 5A, 5B and 5C are explanatory views schematically showing the essential portions of the optical/electrical hybrid device shown in FIG. 4.
Figure 5B:
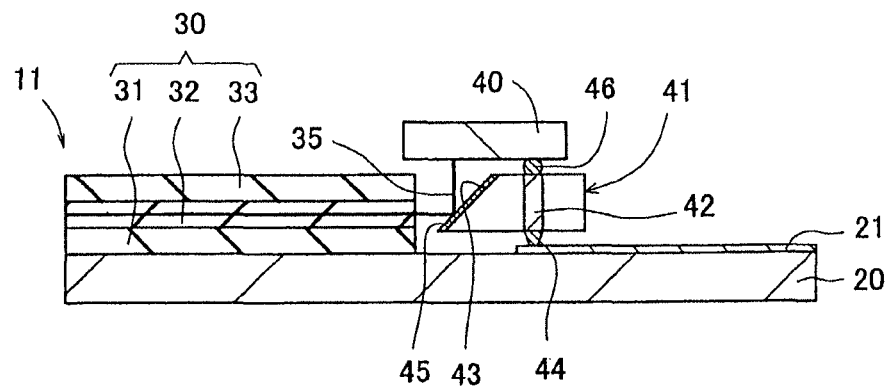
Figure 5C:
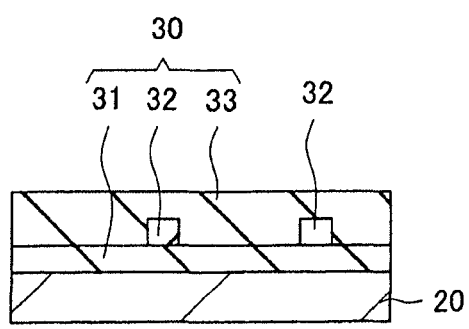

First, an optical/electrical hybrid device having an optical waveguide board in this embodiment will be described. The optical/electrical hybrid device is a device employing a technique wherein part of electric wiring which constitutes an electronic circuit is substituted from the electric wiring into optical wiring which is based on an optical waveguide, so as to transmit a signal by light receiving/emitting elements (signifying a light emitting element and/or a light receiving element). FIG. 4 shows the optical/electrical hybrid device 10 in this embodiment, and FIGS. 5A through 5C show the essential portions of the optical/electrical hybrid device 10.

As shown in FIG. 4 and FIGS. 5A through 5C, the optical/electrical hybrid device 10 includes the optical waveguide board 11. In this embodiment, the optical waveguide board 11 uses a wiring board 20 formed with the electric wiring, as a substrate. The wiring board 20 is, for example, a printed wiring board or a build-up wiring board. The wiring board 20 is formed with a wiring layer (not shown) therein, and it is formed with, for example, wiring patterns 21 and 23 on its surface on which various elements are mounted.

This optical waveguide board 11 has the optical waveguide 30 for transmitting an optical signal 35 to the light emitting element 40 and the light receiving element 50, on the wiring board 20. That is, the optical waveguide board 11 has the electric wiring (wiring board 20) and the optical wiring (optical waveguide 30).

The optical/electrical hybrid device 10 includes various elements mounted on the optical waveguide board 11, for example, the light emitting element 40, the light receiving element 50, driver elements 60 and 70, and logic elements 80 and 90. In this optical/electrical hybrid device 10, the optical signal 35 emitted from the light emitting element 40 is transmitted by the optical waveguide 30 and is received by the light receiving element 50.

Incidentally, the logic elements 80 and 90 control the electronic circuit (for example, the driver elements 60 and 70) of the optical/electrical hybrid device 10. Besides, the driver element 60 drives the light emitting element 40 through, for example, the wiring pattern 21. The driver element 70 drives the light receiving element 50 through, for example, the wiring pattern 23.

The optical waveguide board 11 includes on the side of one end part of the optical waveguide 30, the wiring pattern 21 which is electrically connected with the light emitting element 40, and a component 41 which is disposed on the wiring pattern 21 on the side of one end part of the optical waveguide 30 and which supports the light emitting element 40. Besides, the optical waveguide board 11 includes on the side of the other end part of the optical waveguide 30, the wiring pattern 23 which is electrically connected with the light receiving element 50, and a component 51 which is disposed on the wiring pattern 23 on the other end side of the optical waveguide 30 and which supports the light receiving element 50.

The optical waveguide 30 includes a first clad layer 31 which is formed on the wiring board 20, a core layer 32 which is formed on the first clad layer 31, and a second clad layer 33 which is formed over the first clad layer 31 so as to cover the core layer 32. The core layer 32 is surrounded with the first clad layer 31 and the second clad layer 32, and it is larger in refractive index than these clad layers. For this reason, the optical signal can be transmitted (light can be propagated) by the core layer 32.

The light emitting element 40 is disposed on the side of one end part of the optical waveguide 30. This light emitting element 40 includes a light emitting portion not shown, and a connection terminal 46 which is electrically connected with the conduction portion 42 of the component 41. As the light emitting element 40, it is possible to employ a semiconductor element, for example, a VCSEL (Vertical Cavity Surface Emitting LASER).

The component 41 includes the conduction portion 42 which electrically connects the light emitting element 40 and the wiring pattern 21, a smooth surface 43 which reflects the optical signal 35 appearing between the light emitting element 40 and the optical waveguide 30, and a connection terminal 44 which is electrically connected with the conduction portion 42. Besides, the component 41 includes a metal film 45 which is higher than the smooth surface 43 in a reflection factor for the optical signal 35 and which is provided on the smooth surface 43. Incidentally, as the conduction portion 42 of the component 41, it is possible to employ, for example, a via which communicates from a surface opposing to the wiring pattern 21, to a surface where the light emitting element 40 is mounted.

The material of the component 41 may be any material capable of supporting the light emitting element 40, for example, a semiconductor material or a glass material. In this embodiment, the same semiconductor material as a semiconductor material (for example, silicon) which is the substrate of the light emitting element 40 is employed as the substrate of the component 41.

Thus, the difference of thermal expansion coefficients becomes nonexistent between the component 41 and the light emitting element 40 mounted thereon, so that a thermal stress can be relaxed. Further, since the stress can be relaxed, the optical signal from the light emitting element can be entered into the optical waveguide 30 within design limits, and the transmission efficiency of the optical signal can be enhanced.

Besides, in the case where the semiconductor material, for example, silicon is employed as the substrate of the component 41, the smooth surface 43 is formed on the silicon, and hence, it can be made a mirror surface. The smooth surface 43 formed on the silicon can be smoothed at a precision higher than that of the smooth surface 107 formed in the optical waveguide made from the resin, as in the optical waveguide board 111 explained with reference to FIGS. 1A through 3B, and it can be made the mirror surface.

Therefore, the metal film 45 formed on the smooth surface 43 becomes smoother than the metal film 108 formed on the smooth surface 107. Accordingly, the reflection performance of the mirror can be enhanced with the metal film 45, more than with the metal film 108. That is, the transmission efficiency of the optical signal can be enhanced more.

Besides, the material of the metal film 45 is selected so as to afford the optimum reflection performance for the wavelength of the optical signal, whereby the transmission efficiency of the optical signal can be enhanced. More specifically, the component 41 has the metal film 45 which is higher in the reflection factor for the optical signal than the smooth surface 43 and which is provided on the smooth surface 43. In a case, for example, where the wavelength of the optical signal is 850 nm, gold can be employed. Besides, the gold is employed for the metal film 45, whereby this metal film is also excellent in environment resistance. Incidentally, apart from the gold, aluminum, nickel or the like can be employed as the metal film 45.

Besides, in the case where the semiconductor material, for example, silicon is employed as the substrate of the component 41, the smooth surface 43 is formed on the silicon by cutting, and hence, it can be used also as the mirror surface, namely, the mirror. The reason therefor is that the smooth surface 43 formed on the semiconductor material can be smoothened more than the smooth surface 107 formed in the optical waveguide made from the resin, so it has a certain degree of reflection coefficient.

Besides, in the case of considering the transmission efficiency of the optical signal, the positional precisions of the optical waveguide 30 (core layer 32), the smooth surface 43 (metal film 45) to serve as the mirror, and the conduction portion 42 are important.

The light emitting element 40 which is mounted on the optical waveguide board 11 has the position of the light emitting portion determined with reference to the conduction portion 42. That is, when a positional deviation has appeared between the smooth surface 43 and the conduction portion 42, also the position of the light emitting portion of the light emitting element 40 relative to the smooth surface 43 deviates.

In this embodiment, therefore, the smooth surface 43 and the conduction portion 42 can be precisely formed in the component 41, using the semiconductor material as the substrate of the component 41 and by techniques which are applied to a semiconductor process. That is, the smooth surface 43 and the conduction portion 42 can be formed at a precision higher than that of the positional relation between the smooth surface 107 and the via 110 which are formed in the optical waveguide made from the resin, as in the optical waveguide board 111 explained with reference to FIGS. 1A through 3B.

Besides, the precision of the positioning of the component 41 (smooth surface 43 and conduction portion 42) to the optical waveguide 30 (core layer 32) can be made a high precision like the precision of, for example, a mounter which mounts a semiconductor chip on a wiring board. Concretely, the connection terminal 44 of the component 41 is connected to the connection pad 22 of the wiring pattern 21, whereby the component 41 can be mounted on the wiring board 20 at a high positional precision.

Further, in this embodiment, the needle-like connection terminal 44, for example, a wire is used, and the connection terminal 44 and the connection pad 22 of the wiring pattern are connected in such a manner that the former sticks into the latter. Thus, a height adjustment for making the smooth surface 43 even with the core layer 32 becomes easier than in a case, for example, where the connection terminal 44 and the connection pad 22 are connected through a solder. Besides, by way of example, gold (Au) can be employed for the connection terminal 44 and the connection pad 22. In this case, ultrasonic connection (Au-Au connection) is possible, and a connection reliability can be enhanced. Obviously, soldering can be used to connect the connection terminal and the connection pad.

Accordingly, in the optical waveguide board 11 in this embodiment, the optical signal emitted from the light emitting portion of the light emitting element 40 and reflected by the mirror (smooth surface 43 and metal film 45) enters the optical waveguide 30 (core layer 32) with a suppressed deviation, so that the transmission efficiency of the optical signal can be enhanced.

The light receiving element 50 is disposed on the side of the other end part of the optical waveguide 30. This light receiving element 50 includes a light receiving portion not shown, and a connection terminal 56 which is electrically connected with the conduction portion 52 of the component 51. A semiconductor element, for example, a PD (Photo Diode) can be employed as the light receiving element 50.

The component 51 includes the conduction portion 52 which electrically connects the light receiving element 50 and the wiring pattern 23, a smooth surface 53 which reflects the optical signal appearing between the light receiving element 50 and the optical waveguide 30, and a connection terminal 54 which is electrically connected with the conduction portion 52. Besides, the component 51 includes a metal film 55 which is higher than the smooth surface 53 in a reflection factor for the optical signal and which is provided on the smooth surface 53. Incidentally, as the conduction portion 52 of the component 51, it is possible to employ, for example, a via which communicates from a surface opposing to the wiring pattern 23, to a surface where the light emitting element 50 is mounted.

The material of the component 51 may be any material capable of supporting the light receiving element 50, for example, a semiconductor material or a glass material. In this embodiment, the same semiconductor material as a semiconductor material (for example, silicon) which is the substrate of the light receiving element 50 is employed as the substrate of the component 51.

Thus, the difference of thermal expansion coefficients becomes nonexistent between the component 51 and the light receiving element 50 mounted thereon, so that a thermal stress can be relaxed. Further, since the stress can be relaxed, the optical signal can be caused to exit from the optical waveguide 30 into the light receiving element 50 within design limits, and the transmission efficiency of the optical signal can be enhanced.

Besides, in the case where the semiconductor material, for example, silicon is employed as the substrate of the component 51, the smooth surface 53 is formed on the silicon, and hence, it can be made a mirror surface. The smooth surface 53 formed on the silicon can be smoothed at a precision higher than that of the smooth surface 107 formed in the optical waveguide made from the resin, as in the optical waveguide board 111 explained with reference to FIGS. 1A through 3B, and it can be made the mirror surface.

Therefore, the metal film 55 formed on the smooth surface 53 becomes smoother than the metal film 108 formed on the smooth surface 107. Accordingly, the reflection performance of the mirror can be enhanced with the metal film 55, more than with the metal film 108. That is, the transmission efficiency of the optical signal can be enhanced more.

Besides, the material of the metal film 55 is selected so as to afford the optimum reflection performance for the wavelength of the optical signal, whereby the transmission efficiency of the optical signal can be enhanced. More specifically, the component 51 has the metal film 55 which is higher in the reflection factor for the optical signal than the smooth surface 53 and which is provided on the smooth surface 53. In a case, for example, where the wavelength of the optical signal is 850 nm, gold can be employed. Besides, the gold is employed for the metal film 55, whereby this metal film is also excellent in environment resistance. Incidentally, apart from the gold, aluminum, nickel or the like can be employed as the metal film 55.

Besides, in the case where the semiconductor material, for example, silicon is employed as the substrate of the component 51, the smooth surface 53 is formed on the silicon by cutting, and hence, it can be used also as the mirror surface, namely, the mirror. The reason therefor is that the smooth surface 53 formed on the semiconductor material can be smoothened more than the smooth surface 107 formed in the optical waveguide made from the resin, so it has a certain degree of reflection coefficient.

Besides, in the case of considering the transmission efficiency of the optical signal, the positional precisions of the optical waveguide 30 (core layer 32), the smooth surface 53 (metal film 55) to serve as the mirror, and the conduction portion 52 are important.

The light receiving element 50 which is mounted on the optical waveguide board 11 has the position of the light receiving portion determined with reference to the conduction portion 52. That is, when a positional deviation has appeared between the smooth surface 53 and the conduction portion 52, also the position of the light receiving portion of the light receiving element 50 relative to the smooth surface 53 deviates.

In this embodiment, therefore, the smooth surface 53 and the conduction portion 52 can be precisely formed in the component 51, using the semiconductor material as the substrate of the component 51 and by techniques which are applied to a semiconductor process. That is, the smooth surface 53 and the conduction portion 52 can be formed at a precision higher than that of the positional relation between the smooth surface 107 and the via 110 which are formed in the optical waveguide made from the resin, as in the optical waveguide board 111 explained with reference to FIGS. 1A through 3B.

Besides, the precision of the positioning of the component 51 (smooth surface 53 and conduction portion 52) to the optical waveguide 30 (core layer 32) can be made a high precision like the precision of, for example, a mounter which mounts a semiconductor chip on a wiring board. Concretely, the connection terminal 54 of the component 51 is connected to the connection pad of the wiring pattern 23, whereby the component 51 can be mounted on the wiring board 20 at a high positional precision.

Further, in this embodiment, the needle-like connection terminal 54, for example, a wire is used, and the connection terminal 54 and the connection pad of the wiring pattern 23 are connected in such a manner that the former sticks into the latter. Thus, a height adjustment for making the smooth surface 53 even with the core layer 32 becomes easier than in a case, for example, where the connection terminal 54 and the connection pad are connected through a solder. Besides, by way of example, gold (Au) can be employed for the connection terminal 54 and the connection pad. In this case, ultrasonic connection (Au-Au connection) is possible, and a connection reliability can be enhanced.

Accordingly, in the optical waveguide board 11 in this embodiment, the optical signal reflected by the mirror (smooth surface 53 and metal film 55) and received by the light receiving portion of the light receiving element 50 is caused to emerge from the optical waveguide 30 (core layer 32) with a suppressed deviation, so that the transmission efficiency of the optical signal can be enhanced.

In this manner, in the optical/electrical hybrid device 10, the optical signal emitted from the light emitting element 40 reaches the smooth surface 43 of the component 41, has its transmission direction changed 90° by the reflection and enters the core layer 32 of the optical waveguide 30. The optical signal transmitted along the optical waveguide 30 emerges from the optical waveguide 30 so as to reach the smooth surface 53 of the component 51, has its transmission direction changed 90° by the reflection and is received by the light receiving element 50. Incidentally, the smooth surface 43 of the component 41 and the smooth surface 53 of the component 51 incline 45° relative to the transmission direction of the optical signal within the optical waveguide 30.

With the optical/electrical hybrid device 10 in this embodiment, in the internal electronic circuit, part of the circuit is substituted from the metal wiring (made from, for example, copper) into the optical wiring based on the optical waveguide 30 on account of rise in the operating speed (operating frequency) of the signal transmission. In the optical/electrical hybrid device 10, the light emitting element 40 such as vertical cavity surface emitting LASER and the light receiving element 50 such as photodiode are mounted on the optical waveguide board 11, and the light emitted from the light emitting element 40 is received by the light receiving element 50 through the optical waveguide 30.

Accordingly, the optical/electrical hybrid device 10 performs the signal transmission by the optical waveguide 30 (optical wiring) even in the case where the operating speeds of the logic elements 80 and 90 have become high, so that the occurrence of noise can be made less than in the signal transmission with the electric wiring. Besides, since the signal transmission of a broad band can be performed by the optical waveguide 30, the optical/electrical hybrid device 10 can cope with rises in the operating speeds of the logic elements 80 and 90.

(Method of Manufacturing Optical Waveguide Board)

Next, there will be described a method of manufacturing an optical waveguide board 11 in this embodiment, especially a process until a light emitting element 40 is mounted on the optical waveguide board 11. Incidentally, as stated before, the light emitting element 40 and the light receiving element 50 are in a paired relationship to the optical waveguide 30, and configurations at both the end parts of the optical waveguide 30 become similar. Therefore, a process until the light receiving element 50 is mounted on the optical waveguide board 11 shall be omitted from description.

Figure 6A:
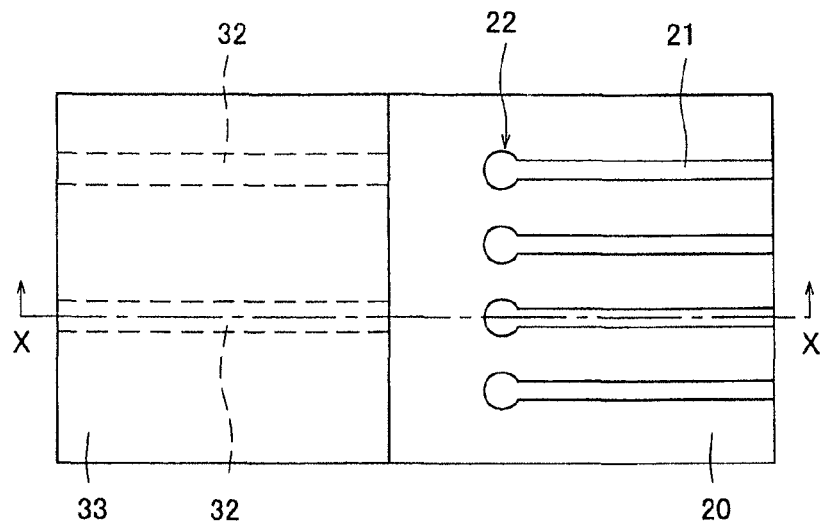
FIGS. 6A and 6B are explanatory views schematically showing the essential portions of an optical waveguide board under manufacturing steps in one embodiment of the present invention.
Figure 6B:
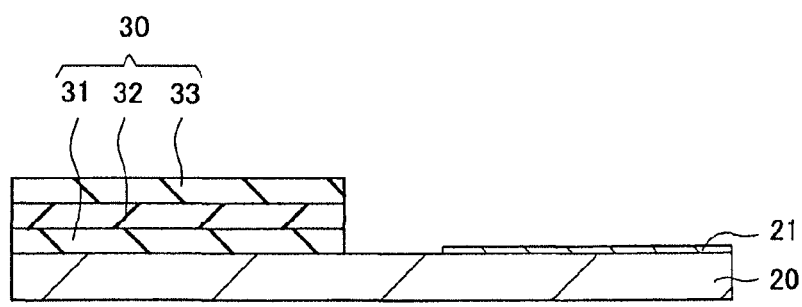

As shown in FIGS. 6A and 6B, a wiring board 20 such as printed wiring board or build-up wiring board, formed by well-known techniques is prepared. Subsequently, wiring patterns such as wiring patterns 21 having connection pads 22 are formed on the wiring board 20.

The wiring patterns 21 are configured in such a way that a copper foil, for example, is formed on, for example, the printed wiring board 20, and that it is thereafter patterned by a photolithographic technique and an etching technique. Besides, the connection pads 22 of the wiring patterns 21 are formed with gold films (not shown) by, for example, sputtering. Incidentally, the diameter of each connection pad 22 within a plane is, for example, 90 µm, and the spacing between the adjacent wiring patterns 21 is, for example, 125 µm.

Subsequently, a resin to become a first clad layer 31 is formed and hardened on the wiring board 20. Subsequently, a resin which is larger in refractive index than the first clad layer 31 and which becomes a core layer 32 is formed and hardened on the first clad layer 31, and it is thereafter patterned so as to extend as the core layer 32. Subsequently, the same resin as that of the first clad layer 31, to become a second clad layer 33, is formed and hardened on the first clad layer 31 so as to cover the core layer 32. Incidentally, the width of each core layer 32 within the plane is, for example, 35 µm, and the pitch between the adjacent patterns of the core layer 32 is, for example, 250 µm. Besides, the width of each core layer 32 within the plane may fall within a range from 10 µm to 50 µm and the width of the first clad layer 31 within the plane may fall within a range from 35 µm to 80 µm.

In this way, the optical waveguide 30 which is configured of the core layer 32, and the first clad layer 31 and second clad layer 33 holding the core layer 32 therebetween, is formed on the surface layer of the wiring board 20. Here, the core layer 32 and the first clad layer 31 and second clad layer 33, namely, the optical waveguide 30 are/is made from, for example, an epoxy type resin or a polyimide type resin, which has excellent optical properties as the optical waveguide 30.

Besides, the resin employed for the core layer 32 and the first clad layer 31 and second clad layer 33 shrink due to the hardening. In this embodiment, the optical waveguide is not formed with the mirror (smooth surface 107 and metal film 108) and the via 110 (conduction portion) as in the optical waveguide board 111 explained with reference to FIGS. 1A through 3B, but a member (component 41) separate from the optical waveguide 30 is formed with a mirror and a via. In other words, the mirror and the via can be formed for the optical waveguide 30 with the influence of the shrinkage of the resin lessened.

Figure 7:
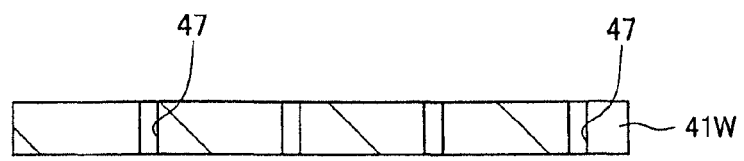
FIG. 7 is a sectional view schematically showing a component for an optical waveguide board, under manufacturing steps in one embodiment of the present invention.
Figure 8:
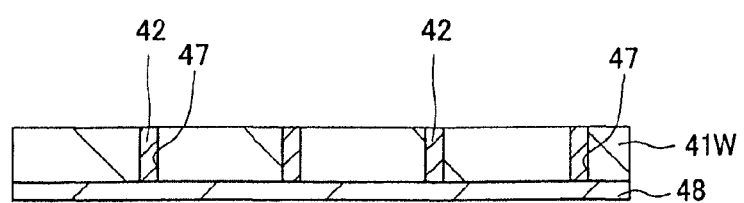
FIG. 8 is a sectional view schematically showing the component for the optical waveguide board, under manufacturing steps subsequent to those of FIG. 7.

Besides, as shown in FIG. 7, a wafer-shaped semiconductor material (semiconductor wafer) 41W which has a first surface, and a second surface being a surface opposite to the first surface, is prepared. The semiconductor wafer 41W serves as the substrate of the component 41. Subsequently, through-holes 47 are formed by, for example, dry etching. Silicon, for example, can be employed for the semiconductor wafer 41W Subsequently, as shown in FIG. 8, a metal plate 48 is fastened on the second surface of the semiconductor wafer 41W, and electroplating is thereafter performed using, for example, the metal plate 48 as a feed layer. Thus, conduction portions 42 (vias) as which copper, for example, is buried from the side of the first surface into the through-holes 47 can be formed.

The optical waveguide board 111 explained with reference to FIGS. 1A through 3B has mentioned the case where the vias 110 are formed by the electroless plating, but the conduction portions 42 (vias) can be formed by the electroplating. That is, the yield of manufactured products can be prevented from degrading due to the insufficient filling of the vias.

Figure 9:
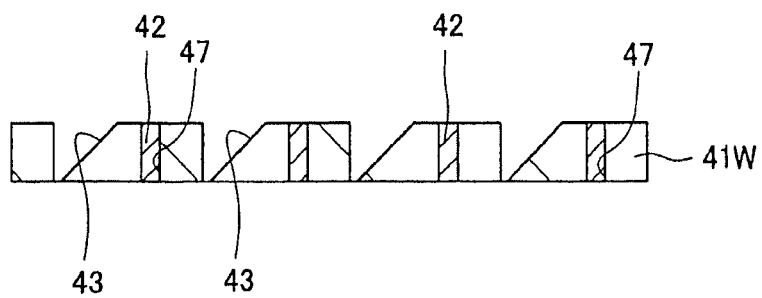
FIG. 9 is a sectional view schematically showing the component for the optical waveguide board, under manufacturing steps subsequent to those of FIG. 8.

Subsequently, the metal plate 48 is removed, and smooth surfaces 43 are thereafter formed as shown in FIG. 9. Concretely, the smooth surfaces 43 are formed by cutting the semiconductor wafer 41W with, for example, a dicer.

Figure 10:
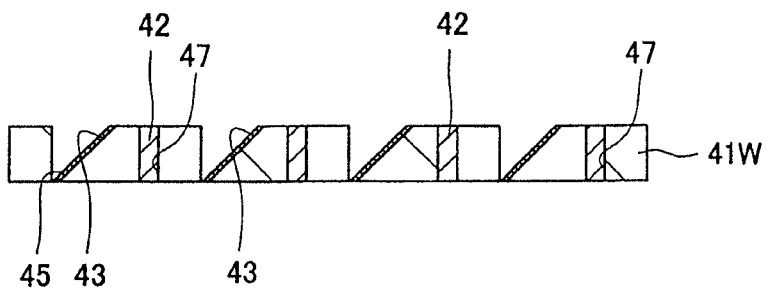
FIG. 10 is a sectional view schematically showing the component for the optical waveguide board, under manufacturing steps subsequent to those of FIG. 9.

Subsequently, as shown in FIG. 10, metal films 45 are formed on the smooth surfaces 43. Concretely, the metal films 45 of gold or the like are selectively formed by, for example, sputtering.

Figure 11:
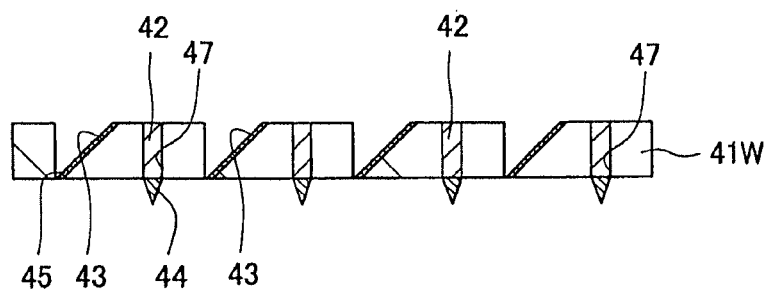
FIG. 11 is a sectional view schematically showing the component for the optical waveguide board, under manufacturing steps subsequent to those of FIG. 10.

Subsequently, as shown in FIG. 11, connection terminals which are connected with the corresponding conduction portions 42 and whose distal ends are needle-shaped are formed. Concretely, the connection terminals 44 whose distal ends are needle-shaped are formed in such a way that wire pieces made of, for example, gold are respectively connected to the conduction portions 42 exposed from the semiconductor wafer 41W. Thereafter, the semiconductor wafer 41W is cut into pellets, whereby components 41 can be formed.

Components 51 can be formed likewise to the components 41. By way of example, the components 41 and the components 51 can also be formed from the identical semiconductor wafer because the conduction portion 52, smooth surface 53, connection terminal 54 and metal film 55 of each component correspond respectively to the conduction portion 42, smooth surface 43, connection terminal 44 and metal film 45 of each component 41.

Figure 12A:
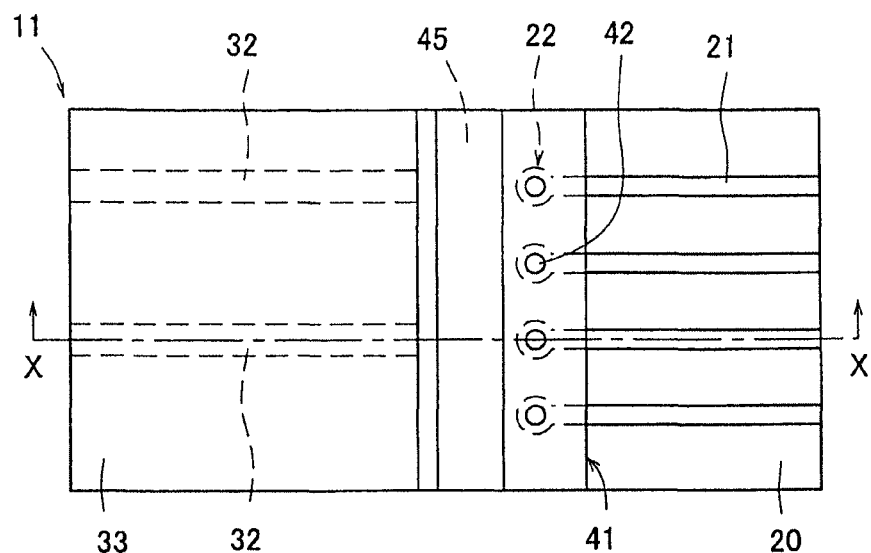
FIGS. 12A and 12B are explanatory views schematically showing the essential portions of the optical waveguide board under manufacturing steps subsequent to those of FIGS. 6A and 6B.
Figure 12B:
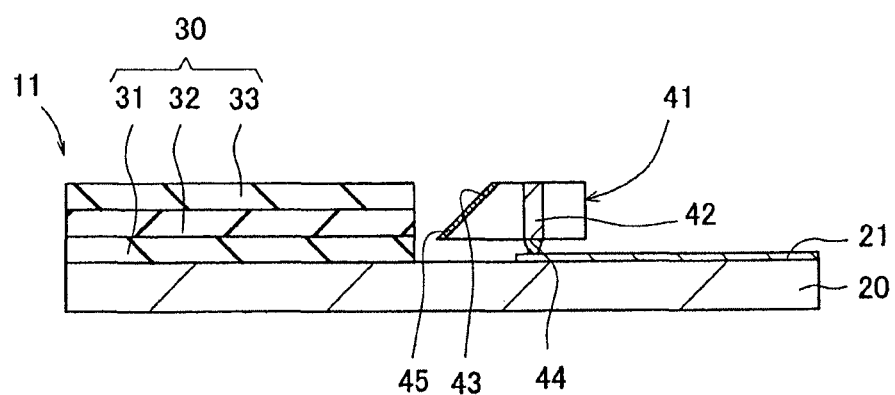

Subsequently, as shown in FIGS. 12A and 12B, the connection terminal 44 is connected to the connection pad 22 of the wiring pattern 21, whereby the component 41 is mounted on the wiring board 20. Concretely, the component is mounted on the wiring board 20 in such a way that, while the height adjustment of the component 41 is being made, the connection terminal 44 whose distal end is needle-shaped is stuck into the connection pad 22. In this way, the optical waveguide board 11 is substantially completed.

Thereafter, a light emitting element 40, a light receiving element 50, driver elements 60 and 70, and logic elements 80 and 90 are mounted on the optical waveguide board 11, whereby an optical/electrical hybrid device 10 shown in FIG. 4 is substantially completed.

Figure 13:
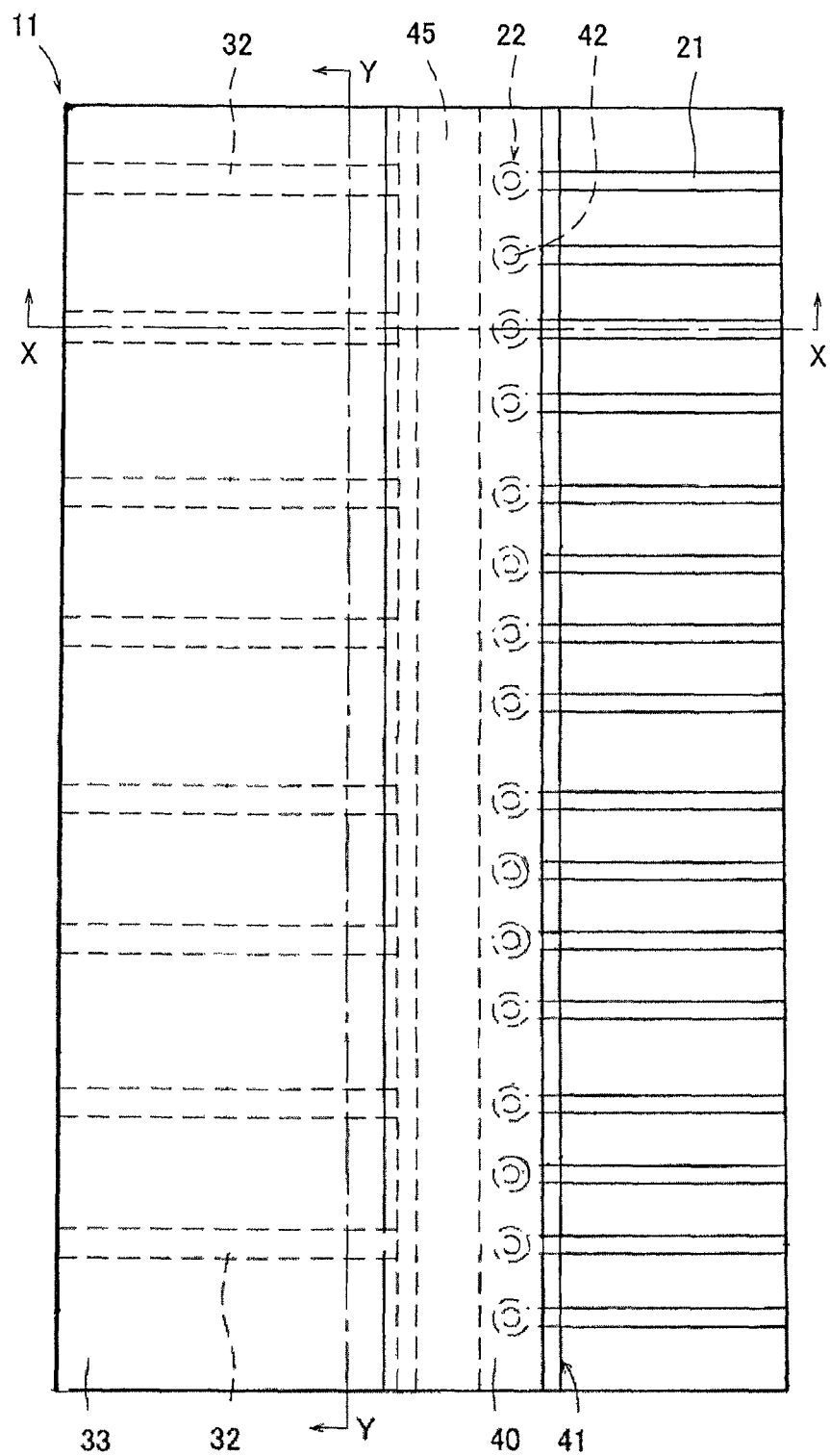
FIG. 13 is an explanatory view schematically showing the essential portions of an optical/electrical hybrid device including eight units, each of which including the optical waveguide board.

Further, an optical/electrical hybrid device including a plurality of units, each of which including the optical waveguide board, may be realized. Besides, FIG. 13 is an explanatory view schematically showing the essential portions of an optical/electrical hybrid device including eight units, each of which including the optical waveguide board.

What is claimed is:

1. An optical waveguide board comprising:
   an optical waveguide configured to transmit an optical signal to and from a light receiving element and a light emitting element;
   wiring patterns that are electrically connected with the light receiving and emitting elements, respectively; and
   supporting members disposed on the wiring patterns on sides of end parts of the optical waveguide, the supporting members supporting the light receiving and emitting elements, respectively; wherein
   each of the supporting members includes:
      a conduction portion comprising a via penetrating the supporting member, a connection terminal electrically connected to a corresponding one of the light receiving and emitting elements, and a connection terminal electrically connected to a corresponding wiring pattern; and
      a smooth exterior surface configured to reflect the optical signal appearing between the corresponding one of the light receiving and emitting elements and the optical waveguide.

2. The optical waveguide board according to claim 1, wherein:
   each of the supporting members includes a connection terminal which is electrically connected with the conduction portion;
   the optical waveguide includes a first clad layer which is disposed on a substrate of the optical waveguide board, a core layer which is disposed on the first clad layer, and a second clad layer which is disposed on the core layer; and
   an end of the connection terminal that is electrically connected to the wiring pattern is disposed on a connection pad of the wiring pattern so that the smooth surface faces the core layer.

3. The optical waveguide board according to claim 1, wherein each of the supporting members includes a substrate made of the same material as substrates of the light receiving and emitting elements.

4. The optical waveguide board according to claim 1, further comprising a metal film disposed on the smooth surface.

5. An optical/electrical hybrid device comprising:
   eight units, each of which including
   an optical waveguide configured to transmit an optical signal to and from a light receiving element and a light emitting element;
   wiring patterns that are electrically connected with the light receiving and emitting elements, respectively; and
   supporting members disposed on the wiring patterns on sides of end parts of the optical waveguide, the supporting members supporting the light receiving and emitting elements, respectively; wherein
   each of the supporting members includes:
      a conduction portion comprising a via penetrating the supporting member, a connection terminal electrically connected to a corresponding one of the light receiving and emitting elements, and a connection terminal electrically connected to a corresponding wiring pattern; and a smooth exterior surface configured to reflect the optical signal appearing between the corresponding one of the light receiving and emitting elements and the optical waveguide.

\* \* \* \* \*